(12) United States Patent
Si

(10) Patent No.: US 10,667,416 B2
(45) Date of Patent: May 26, 2020

(54) FOLDABLE DEVICE AND METHOD FOR INSTALLING THE SAME

(71) Applicant: Beijing Xiaomi Mobile Software Co., Ltd., Beijing (CN)

(72) Inventor: Xinwei Si, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 16/452,683

(22) Filed: Jun. 26, 2019

(65) Prior Publication Data
US 2020/0037458 A1    Jan. 30, 2020

(30) Foreign Application Priority Data

Jul. 27, 2018    (CN) .......................... 2018 1 0840355

(51) Int. Cl.
| | |
|---|---|
| *H05K 5/02* | (2006.01) |
| *G06F 1/16* | (2006.01) |
| *H05K 5/00* | (2006.01) |
| *H04M 1/02* | (2006.01) |

(52) U.S. Cl.
CPC ......... *H05K 5/0226* (2013.01); *G06F 1/1652* (2013.01); *H05K 5/0017* (2013.01); *H04M 1/0268* (2013.01)

(58) Field of Classification Search
CPC combination set(s) only.
See application file for complete search history.

(56) References Cited

U.S. PATENT DOCUMENTS

| | | | | |
|---|---|---|---|---|
| 9,250,733 | B2* | 2/2016 | Lee | H04M 1/02 |
| 9,798,359 | B2* | 10/2017 | Seo | G06F 1/1652 |
| 9,811,119 | B2* | 11/2017 | Seo | G06F 1/1652 |
| 9,851,759 | B2* | 12/2017 | Tazbaz | G06F 1/1681 |
| 9,910,458 | B2* | 3/2018 | Watanabe | G09F 9/00 |
| 9,927,841 | B2* | 3/2018 | Gheorghiu | G06F 1/1652 |
| 9,964,995 | B1* | 5/2018 | Morrison | H01Q 1/243 |
| 10,001,811 | B1* | 6/2018 | Watamura | G06F 1/1652 |

(Continued)

FOREIGN PATENT DOCUMENTS

| | | |
|---|---|---|
| CN | 104916231 A | 9/2015 |
| CN | 105825775 A | 8/2016 |

(Continued)

OTHER PUBLICATIONS

European Search Report dated Jan. 8, 2020, in counterpart European Application No. 19182199.0-1221.

*Primary Examiner* — Lisa Lea-Edmonds
(74) *Attorney, Agent, or Firm* — Finnegan, Henderson, Farabow, Garrett & Dunner, L.L.P.

(57) ABSTRACT

The present disclosure relates to a foldable device and a method for installing the same, and belongs to the field of electronic technology. The foldable device includes: a first housing, a second housing, a flexible display screen, a rotating shaft and a flexible covering layer, wherein the first housing and the second housing are connected by the rotating shaft, the flexible covering layer is respectively connected to the first housing and the second housing and surrounds the outer side of the rotating shaft, and the flexible display screen is respectively connected to the first housing and the second housing and is located on the inner sides of the first housing, the second housing, and the rotating shaft.

10 Claims, 8 Drawing Sheets

(56) References Cited

U.S. PATENT DOCUMENTS

| | | | |
|---|---|---|---|
| 10,015,897 B1* | 7/2018 | Hong | G09F 9/301 |
| 10,067,536 B1* | 9/2018 | Watamura | G06F 1/1616 |
| 10,082,827 B2* | 9/2018 | Yamauchi | G06F 1/1626 |
| 10,082,838 B1* | 9/2018 | Hong | E05D 7/00 |
| 10,082,839 B1* | 9/2018 | Turchin | G06F 1/1652 |
| 10,120,421 B1* | 11/2018 | Hong | G06F 1/1681 |
| 10,185,355 B2* | 1/2019 | Watamura | G06F 1/1681 |
| 10,228,722 B2* | 3/2019 | Watamura | G06F 1/1616 |
| 10,234,907 B2* | 3/2019 | Knoppert | G06F 1/1681 |
| 10,306,783 B2* | 5/2019 | Seo | H04M 1/0216 |
| 10,310,565 B2* | 6/2019 | Aoki | G06F 1/1652 |
| 10,365,691 B2* | 7/2019 | Bae | G06F 1/1652 |
| 10,367,164 B2* | 7/2019 | Ahn | G06F 1/1681 |
| 10,386,886 B2* | 8/2019 | Yamauchi | G06F 1/1637 |
| 10,416,710 B2* | 9/2019 | Mizoguchi | G06F 1/1681 |
| 10,431,129 B2* | 10/2019 | Wakata | H01L 27/32 |
| 10,481,634 B2* | 11/2019 | Mizoguchi | G06F 1/1652 |
| 2010/0246103 A1* | 9/2010 | Visser | G06F 1/1616 361/679.01 |
| 2015/0233162 A1 | 8/2015 | Lee et al. | |
| 2015/0370287 A1* | 12/2015 | Ko | G06F 1/1626 361/749 |
| 2016/0195901 A1 | 7/2016 | Kauhaniemi et al. | |
| 2017/0142847 A1* | 5/2017 | Park | H05K 5/0017 |
| 2017/0374749 A1* | 12/2017 | Lee | E05D 11/0054 |
| 2018/0173278 A1* | 6/2018 | Tamaki | G06F 1/1643 |
| 2018/0196469 A1 | 7/2018 | Yamauchi et al. | |
| 2018/0267574 A1* | 9/2018 | Cho | G06F 1/1652 |
| 2019/0132432 A1* | 5/2019 | Park | H04M 1/0216 |
| 2019/0245955 A1* | 8/2019 | Lee | G06F 1/1616 |
| 2019/0250663 A1* | 8/2019 | Park | G06F 1/1681 |

FOREIGN PATENT DOCUMENTS

| | | |
|---|---|---|
| CN | 205454263 U | 8/2016 |
| CN | 205751382 U | 11/2016 |
| JP | 2018060202 A | 4/2018 |
| KR | 20140050504 A | 4/2014 |
| WO | WO 2016/109123 A1 | 7/2016 |
| WO | WO 2016/206197 A1 | 12/2016 |

* cited by examiner

The flexible covering layer is respectively connected to the first housing and the second housing. — 701

The rotating shaft is respectively connected to the first housing and the second housing such that the rotating shaft is located on the inner side of the flexible covering layer — 702

Fig. 7

FOLDABLE DEVICE AND METHOD FOR INSTALLING THE SAME

CROSS REFERENCE

This application is based upon and claims priority to Chinese Patent Application No. 201810840355.X, filed on Jul. 27, 2018, the entire contents thereof are incorporated herein by reference.

TECHNICAL FIELD

The present disclosure relates to the field of electronic technology, and more particularly to a foldable device and a method for installing the same.

BACKGROUND

With the rapid development of electronic technology and the rise of diverse devices, foldable devices have become a developing trend. A foldable device is not only provided with a foldable housing, but also has a foldable flexible display screen. When the foldable device is in the folded state, the space occupied by the device can be reduced, and when the foldable device is in the unfolded state, the user can be provided with a large use area of the flexible display screen, thereby improving the user viewing effect.

In the related art, the foldable device is configured with a two-part housing and a display screen, and the two parts of the housing are coupled by a rotating shaft, about which each part of the housing is rotatable. When the two parts of the housing are respectively located on both sides of the rotating shaft, the display screen is in an unfolded state to show the user a complete display screen, and the user can use the foldable device. When the two parts of the housing are folded on the same side of the rotating shaft after rotation, the display screen is also in a folded state, thereby achieving the folding effect of the device.

SUMMARY

The present disclosure provides a foldable device and an installation method capable of overcoming the problems in the related art. The technical solution is as follows:

In a first aspect, there is provided a foldable device comprising: a first housing, a second housing, a flexible display screen, a rotating shaft and a flexible covering layer, the first housing and the second housing are connected by the rotating shaft; the flexible covering layer is respectively connected to the first housing and the second housing and surrounds an outer side of the rotating shaft, and the flexible display screen is respectively connected to the first housing and the second housing and is located on inner sides of the first housing, the second housing, and the rotating shaft.

In a second aspect, there is provided a method for installing the foldable device according to the first aspect, and the method includes: connecting the flexible covering layer respectively to the first housing and the second housing; and connecting the rotating shaft respectively to the first housing and the second housing such that the rotating shaft is located on the inner side of the flexible covering layer.

BRIEF DESCRIPTION OF THE DRAWINGS

The appended drawings herein are incorporated into the specification and form a part of the specification, explaining the principles of the disclosure together with the specification.

FIG. 7 is a flowchart of a method of installing a foldable device according to an exemplary embodiment.

DETAILED DESCRIPTION

The technical solutions in the embodiments of the present disclosure are clearly and completely described in the following with reference to the accompanying drawings in the embodiments of the present disclosure. The described embodiments are exemplary embodiments of the present disclosure, and not all of the embodiments. All other embodiments obtained by persons skilled in the art based on the described embodiments of the present disclosure without the inventive work are all within the scope of the disclosure.

Exemplary embodiments will be described in detail herein, examples of which are illustrated in the accompanying drawings. When the following description relates to the accompanying drawings, the same number in different accompanying drawings denotes the same or similar elements, unless otherwise indicated. The embodiments described in the following exemplary embodiments do not represent all embodiments consistent with the present disclosure. On the contrary, they are only examples of devices and methods that are consistent with some aspects of the present disclosure as detailed in the attached claims.

Figure 1:
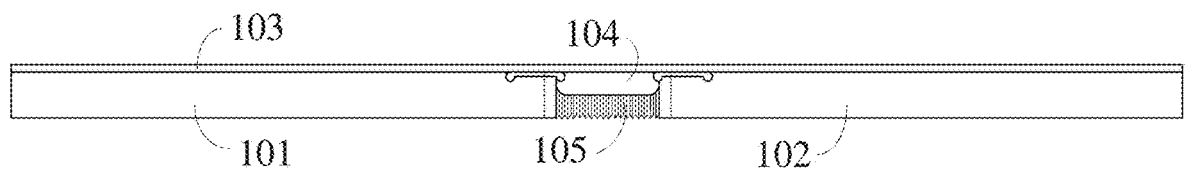
FIG. 1 is a schematic diagram of a foldable device according to an exemplary embodiment.

FIG. 1 is a schematic diagram of a foldable device according to an exemplary embodiment. The foldable device may be a mobile phone, a tablet computer, or the like. Referring to FIG. 1, the foldable device includes: a first housing 101, a second housing 102, a flexible display screen 103, a rotating shaft 104, and a flexible covering layer 105.

In the embodiment, the first housing 101 and the second housing 102 are connected by the rotating shaft 104. The first housing 101 and the second housing 102 are rotatable about the rotating shaft 104 so that the flexible display screen located on the inner sides of the first housing 101, the second housing 102, and the rotating shaft 104 is unfolded or folded. A state of the foldable device can be changed by rotating the first housing 101 or the second housing 102.

The flexible display screen 103 is located on the inner sides of the first housing 101, the second housing 102, and the rotating shaft 104. One side of the flexible display screen 103 is attached to the first housing 101 and the second housing 102, and the other side is used for display. During the rotation of the first housing 101 or the second housing 102 about the rotating shaft 104, the flexible display screen 103 may be deformed as the position of the first housing 101 or the second housing 102 changes. Wherein, the flexible display screen 103 is made of a soft material and is a bendable and deformable display member.

In an embodiment, when the foldable device is in the unfolded state, the first housing 101 or the second housing 102 is rotated about the rotating shaft 104, so that the flexible display screen 103 is bent until the two parts of the flexible display screen 103 are in close contact with each other, at which time the foldable device is in a fully folded state.

For example, with reference to the first housing 101, the second housing 102 is rotated about the rotating shaft 104 and can be gradually approached to the first housing 101 until the foldable device is fully folded. Alternatively, with reference to the second housing 102, the first housing 101 is rotated about the rotating shaft 104 and can be gradually approached to the second housing 102 until the foldable device is fully folded.

In an embodiment, when the foldable device is in the folded state, the first housing 101 or the second housing 102 is rotated about the rotating shaft 104, so that the flexible display screen 103 is gradually unfolded until the flexible display screen 103 is fully deployed into a plane, and the first housing 101, the second housing 102, and the rotating shaft 104 are in the same plane.

For example, with reference to the first housing 101, the second housing 102 rotates about the rotating shaft 104, gradually away from the first housing 101 until the foldable device is fully deployed. Alternatively, with reference to the second housing 102, the first housing 101 rotates about the rotating shaft 104, gradually away from the second housing 102 until the foldable device is fully deployed.

In addition, the flexible covering layer 105 is connected to the first housing 101 and the second housing 102, respectively, and surrounds the outer side of the rotating shaft 104.

For example, the flexible covering layer 105 is respectively connected to the first housing 101 and the second housing 102 by a viscous substance, wherein the viscous substance may be a glue or a double-sided tape. Alternatively and/or additionally, the flexible covering layer 105 may be connected to the first housing 101 and the second housing 102, respectively, by a hot-pressing process.

In an embodiment, the flexible covering layer 105 comprises a flexible material, which may be a material such as polyimide (PI), polyethylene terephthalate (PET), thermoplastic polyurethane elastomer (TPU), or silica gel. The thickness of the flexible covering layer is determined according to the thickness of the first and second housings 101 and 102 and the thickness of the rotating shaft 104, and may be, for example, 0.5 mm or other sizes.

In the foldable device provided by the embodiment of the present disclosure, the connection region between the first housing 101 and the second housing 102 has a rotating shaft 104 and a flexible covering layer 105, and the rotating shaft 104 is located on the inner side, and the flexible covering layer 105 is located on the outer side of the rotating shaft 104, so that the rotation function can be ensured, and the rotating shaft 104 can be protected by the flexible covering layer 105.

The foldable device of the related art is provided with a rotating shaft between the two parts of the housing, and the two parts of the housing are connected by the rotating shaft, and the rotating shaft is directly exposed to the external environment, so the rotating shaft is easily affected by impurities such as moisture and dust in the external environment. Since the rotating shaft adopts a complicated mechanical structure, external impurities are likely to cause the rotating shaft to malfunction, affecting the normal use of the foldable device.

The foldable device provided by the embodiment of the present disclosure includes a first housing, a second housing, a flexible display screen, a rotating shaft and a flexible covering layer, wherein the first housing and the second housing are connected by the rotating shaft, the flexible covering layer is respectively connected to the first housing and the second housing and surrounds the outer side of the rotating shaft, and the flexible display screen is respectively connected to the first housing and the second housing and is located on the inner sides of the first housing, the second housing, and the rotating shaft. By covering the flexible covering layer on the outer side of the rotating shaft, the rotating shaft can be effectively isolated from the external environment, so that the rotating function can be ensured, and the rotating shaft can be prevented from being affected by impurities such as moisture and dust in the external environment. By protecting the rotating shaft with the flexible covering layer, the reliability of the rotating shaft is improved, the service life of the rotating shaft is extended, and the normal use of the foldable device is ensured.

Figure 2:
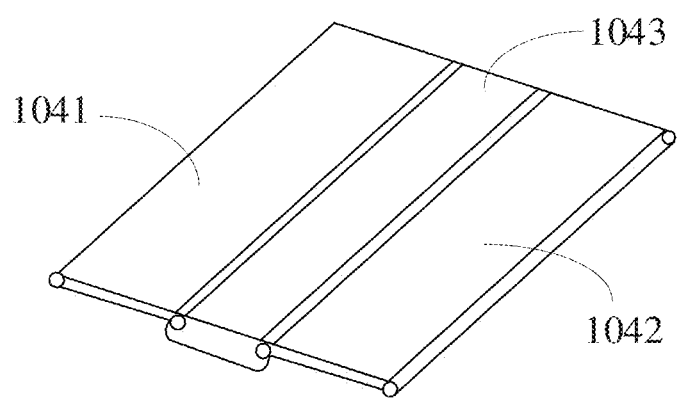
FIG. 2 is a schematic diagram of a rotating shaft according to an exemplary embodiment.
Figure 3:
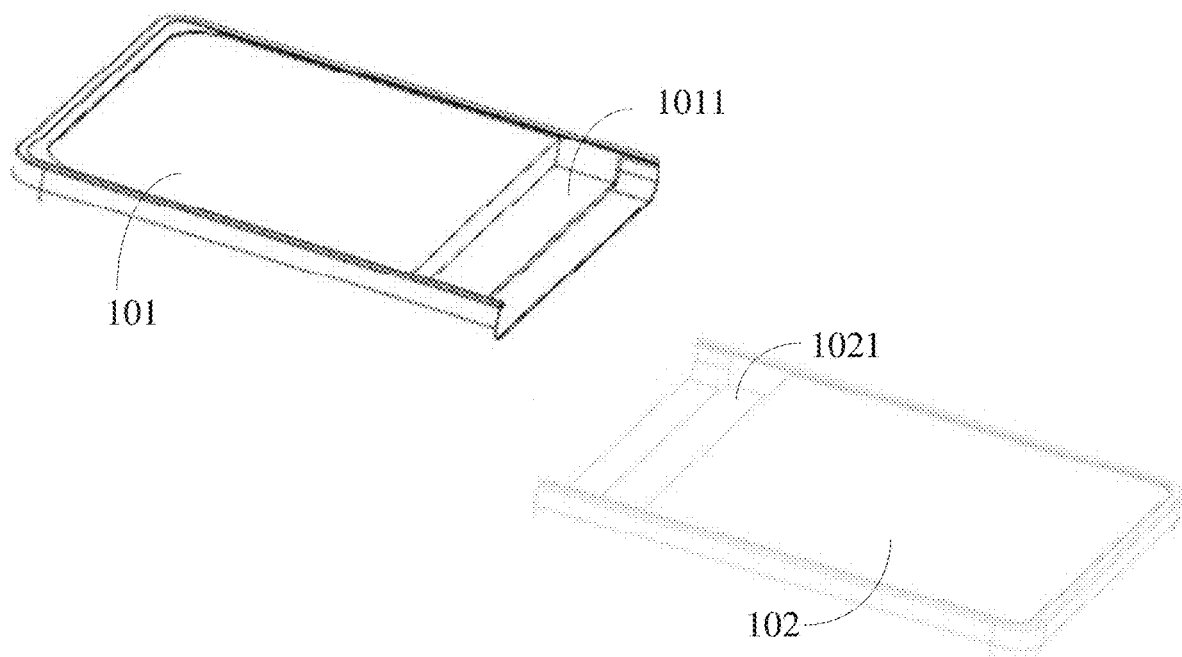
FIG. 3 is a schematic diagram of a first housing and a second housing according to an exemplary embodiment.

In an embodiment, referring to FIG. 2 and FIG. 3, the rotating shaft 104 includes: a first member 1041, a second member 1042, and a connecting member 1043. The first member 1041 and the second member 1042 are connected by the connecting member 1043 and are rotatable about the connecting member 1043. The flexible covering layer 105 surrounds the outer side of the connecting member 1043.

The first housing 101 is provided with a first slot 1011, and the second housing 102 is provided with a second slot 1021. The connection of the first housing 101 and the second housing 102 by the rotating shaft 104 includes: engaging the first member 1041 with the first slot 1011, and engaging the second member 1042 with the second slot 1021. The first member 1041 and the second member 1042 after the engaging connection are connected by the connecting member 1043, and the flexible covering layer 105 surrounds the outer side of the connecting member 1043.

The first member 1041 and the first housing 101 are engaged together by the first slot 1011 to form an integrated structure, and the second member 1042 and the second housing 102 are engaged together by the second slot 1021 to also form an integrated structure. When the first housing 101 rotates about the rotating shaft 104, substantially, it is the first housing 101 that drives the first member 1041 that is engaged with the first housing 101 to rotate about the connecting member 1043; and when the second housing 102 rotates about the rotating shaft 104, substantially, it is the second housing 102 that drives the first member 1042 that is engaged with the second housing 102 to rotate about the connecting member 1043.

The rotating shaft of the foldable device provided by the embodiment of the present disclosure includes a first member, a second member, and a connecting member. The first housing is provided with a first slot, the second housing is provided with a second slot, and the first member is engaged with the first slot and the second member is engaged with the second slot. The first member and the second member are connected by the connecting member so that the first housing, the second housing, and the rotating shaft can be stably connected. By covering the flexible covering layer on the outer side of the rotating shaft, the rotating shaft can be effectively isolated from the external environment, so that the rotating shaft can be prevented from being affected by impurities such as moisture and dust in the external environment, the reliability of the rotating shaft is improved, the service life of the rotating shaft is extended, and the normal use of the foldable device is ensured.

Figure 4:
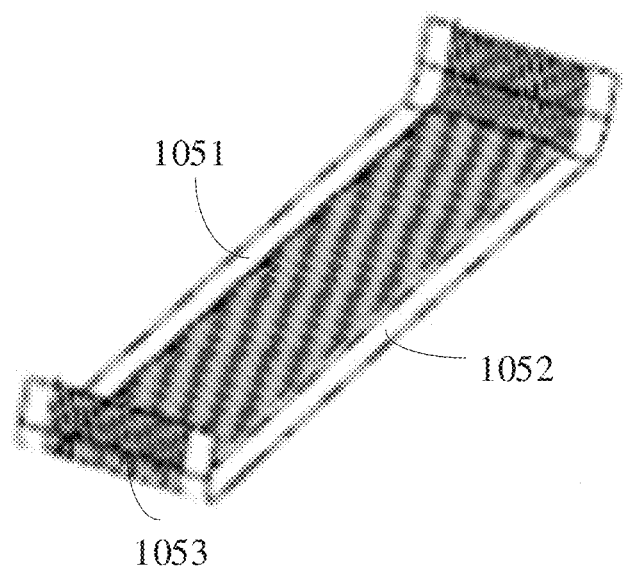
FIG. 4 is a schematic diagram of a flexible covering layer according to an exemplary embodiment.

In an embodiment, referring to FIG. 4, the flexible covering layer 105 includes a first end 1051 and a second end 1052, and a corrugated layer 1053 is disposed between the first end 1051 and the second end 1052. The corrugated layer 1053 operates in some aspects similar to a bellows and is also referred to herein as the bellows type layer 1053.

The connections of the flexible covering layer 105 respectively with the first housing 101 and the second housing 102 and the surrounding of the flexible covering layer 105 on the outer side of the rotating shaft 104 include: connecting the first end 1051 of the flexible covering layer 105 to the first housing 101, connecting the second end 1052 to the second housing 102, and surrounding the outer side of the rotating shaft 104 with the bellows type layer 1053.

In an embodiment, the first end 1051 of the flexible covering layer 105 is connected to the first housing 101 by a viscous substance, and the second end 1052 of the flexible covering layer 105 is connected to the second housing 102 by a viscous substance, wherein, the viscous substance may be a glue or a double-sided tape.

In another embodiment, the first end 1051 of the flexible covering layer 105 is connected to the first housing 101 by a hot-pressing process, and the second end 1052 of the flexible covering layer 105 is connected to the second housing 102 by a hot-pressing process.

In the present embodiment, in the first housing 101 and the second housing 102, a side connected to the flexible display screen 103 is referred to as an inner surface, and a plane opposite to the inner surface is referred to as an outer surface, a side edge portion between the inner surface and the outer surface is referred to as a side surface. Wherein, the inner surface and the outer surface are both flat, and the side surface is a curved surface. The shape of the flexible covering layer 105 matches the shapes of the first housing 101 and the second housing 102, that is, the lower surface of the flexible covering layer is a flat surface, and the side surface is a curved surface, so that it is ensured that the lower surface and the side surface of the rotating shaft 104 are surrounded by the flexible covering layer 105, and also it is ensured that the shape of the flexible covering layer is consistent with the surfaces of the first housing and the second housing, thereby ensuring uniformity in appearance of the foldable device.

In an embodiment, a mold matching the shape of the housing, with a flat surface at both ends and a jagged shape in the middle, may be provided. A flexible material is filled in the mold, and the flexible covering layer 105 conforming to the shape of the mold is formed by hot-pressing to make the flexible covering layer 105 have a foldable structure like a floor screen. The foldable structure can be stretched when deployed, compensating for an increased distance as the outer sides of the first housing 101 and the second housing 102 gradually separated when the inner sides of the first housing 101 and the second housing 102 gradually approach.

Figure 5:
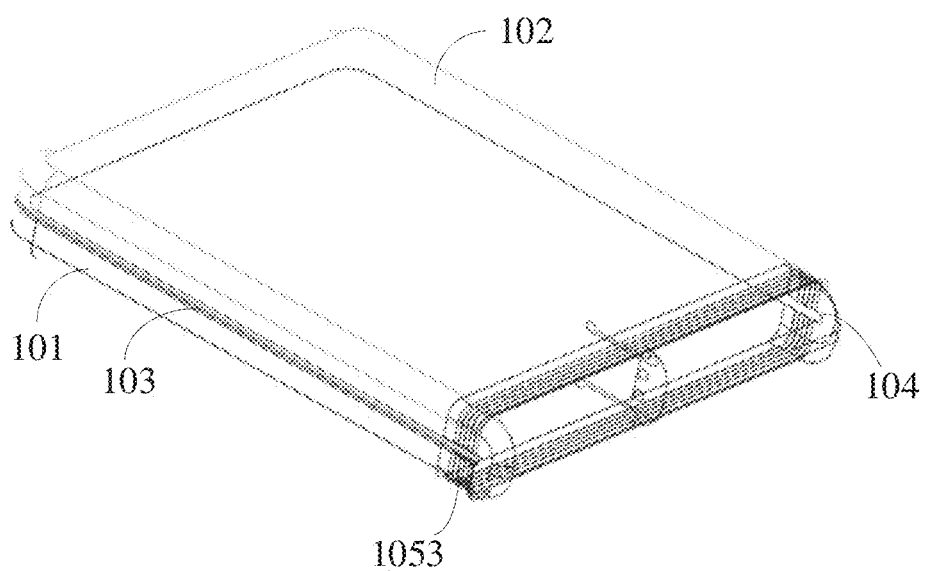
FIG. 5 is a schematic diagram of a foldable device in a fully folded state according to an exemplary embodiment.

Referring to FIG. 5, when the first housing 101 or the second housing 102 rotates about the rotating shaft 104 to bring the first housing 101 close to the second housing 102, the bellows type layer 1053 is gradually unfolded until a part of the flexible display screen on the inner side of the first housing 101 is completely attached to a part of the flexible display screen on the inner side the second housing 102.

At this time, the flexible covering layer 105 is unfolded on the bellows type layer 1053 and covered on the outer side of the rotating shaft 104, so that the rotating shaft 104 is completely covered in the flexible covering layer 105 to avoid direct exposure to the external environment.

Figure 6:
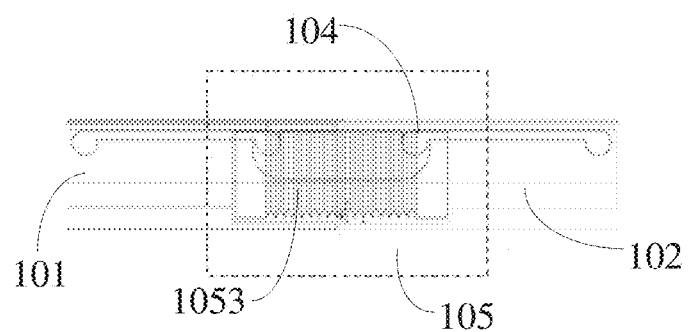
FIG. 6 is a schematic diagram of a foldable device in a fully unfolded state according to an exemplary embodiment.

Referring to FIG. 6, when the first housing 101 or the second housing 102 rotates about the rotating shaft 104 to move the first housing 101 away from the second housing 102, the bellows type layer 1053 is gradually compressed until the flexible display screen on the inner sides of the first housing 101, the second housing 102, and the rotating shaft 104 is deployed to be completely in the same plane, and the outer surface of the bellows type layer 1053, the outer surface of the first housing 101, and the outer surface of the second housing 102 are located on the same plane.

At this time, the flexible covering layer 105 is folded at the bellows type layer 1053, and is disposed between the first housing 101 and the second housing 102 and on the outer side of the rotating shaft 104, so that the outer surfaces of the first housing 101, the second housing 102, and the bellows type layer 1053 can be in the same plane, which ensures the uniformity of the appearance of the foldable device.

FIG. 7 is a flowchart of a method for installing a foldable device according to an exemplary embodiment, wherein the method is applied to the foldable device described in the foregoing embodiments. As shown in FIG. 7, the method includes the steps as follows.

In step 701, the flexible covering layer is respectively connected to the first housing and the second housing.

In step 702, the rotating shaft is respectively connected to the first housing and the second housing such that the rotating shaft is located on the inner side of the flexible covering layer.

The method provided by the embodiment of the present disclosure connects the flexible covering layer to the first housing and the second housing respectively, and then connects the rotating shaft to the first housing and the second housing respectively, so that the rotating shaft is located on the inner side of the flexible covering layer. The flexible covering layer effectively isolates the rotating shaft from the external environment in which it is placed, thereby preventing the rotating shaft from being affected by impurities such as moisture and dust in the external environment, improving the reliability of the rotating shaft, prolonging the service life of the rotating shaft, and ensuring normal use of foldable device.

In an embodiment, the rotating shaft includes: a first member, a second member, and a connecting member, and the respective connections of the rotating shaft to the first housing and the second housing include: engaging the first member with the first slot provided in the first housing; and engaging the second member with the second slot provided in the second housing.

In another embodiment, the method further includes: unfolding the bellows type layer of the flexible covering layer during rotation of the first housing about the rotating shaft and close to the second housing; or, unfolding the bellows type layer of the flexible covering layer during rotation of the second housing about the rotating shaft and close to the first housing.

In another embodiment, the method further includes: compressing the bellows type layer of the flexible covering layer during rotation of the first housing about the rotating shaft and away from the second housing; or, compressing the bellows type layer of the flexible covering layer during rotation of the second housing about the rotating shaft and away from the first housing.

Figure 8:
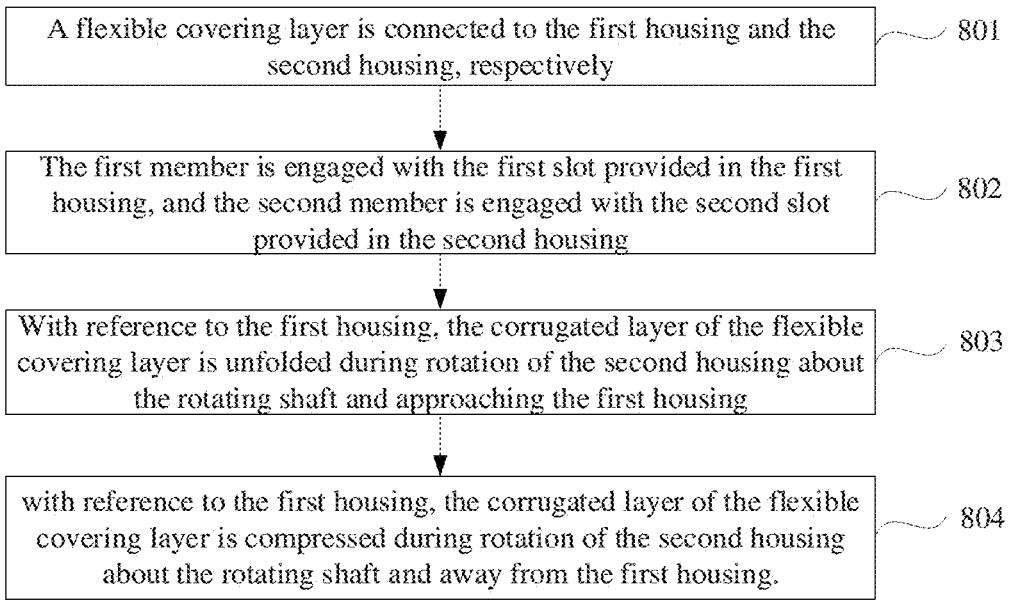
FIG. 8 is a flowchart of a method of installing a foldable device according to an exemplary embodiment.

FIG. 8 is a flowchart of a method for installing a foldable device according to an exemplary embodiment, wherein the method is applied to the foldable device described in the foregoing embodiment. As shown in FIG. 8, the method includes the steps as follows.

In step 801, a flexible covering layer is connected to the first housing and the second housing, respectively.

Wherein, the flexible covering layer includes a first end and a second end, the first end is connected to the first housing, and the second end is connected to the second housing.

In step 802, the first member is engaged with the first slot provided in the first housing, and the second member is engaged with the second slot provided in the second housing.

The first housing of the foldable device may be provided with a first slot, and the second housing may be provided with a second slot. The rotating shaft of the foldable device includes a first member, a second member, and a connecting member, and the first member and the second member are connected by the connecting member and rotatable about the connecting member.

The connection of the first housing and the second housing by the rotating shaft includes engaging the first member of the rotating shaft with the first slot provided in the first housing, and engaging the second member of the rotating shaft with the second slot provided in the second housing.

In step 803, with reference to the first housing, the bellows type layer (i.e., the corrugated layer) of the flexible covering layer is unfolded during rotation of the second housing about the rotating shaft and approaching the first housing.

As the rotation about the rotating shaft, the second housing gradually approaches the first housing until the flexible display screen on the inner sides of the first housing, the second housing and the rotating shaft is deployed to be completely in the same plane, and the outer surface of the bellows type layer, the outer surface of the first housing, and the outer surface of the second housing are located on the same plane.

In another embodiment, with reference to the second housing, the bellows type layer of the flexible covering layer is unfolded during rotation of the first housing about the rotating shaft and approaching the second housing.

As the rotation about the rotating shaft, the first housing gradually approaches the second housing until the flexible display screen on the inner sides of the first housing, the second housing and the rotating shaft is deployed to be completely in the same plane, and the outer surface of the bellows type layer, the outer surface of the first housing, and the outer surface of the second housing are located on the same plane.

In step 804, with reference to the first housing, the bellows type layer (i.e., the corrugated layer) of the flexible covering layer is compressed during rotation of the second housing about the rotating shaft and away from the first housing.

As the rotation about the rotating shaft, the second housing gradually moves away from the first housing until the first housing, the second housing and the rotating shaft are in the same plane position. At this time, the flexible display screen on the inner sides of the first housing, the second housing, and the rotating shaft is deployed to be completely in the same plane, and the outer surface of the bellows type layer, the outer surface of the first housing, and the outer surface of the second housing are located on the same plane.

In another embodiment, with reference to the second housing, the bellows type layer of the flexible covering layer is compressed during rotation of the first housing about the rotating shaft and away from the second housing.

As the rotation about the rotating shaft, the first housing gradually moves away from the second housing until the first housing, the second housing and the rotating shaft are in the same plane position. At this time, the flexible display screen on the inner sides of the first housing, the second housing, and the rotating shaft is deployed to be completely in the same plane, and the outer surface of the bellows type layer, the outer surface of the first housing, and the outer surface of the second housing are located on the same plane.

The method provided by the embodiment of the present disclosure connects the flexible covering layer to the first housing and the second housing respectively, and then connects the rotating shaft to the first housing and the second housing respectively, so that the rotating shaft is located on the inner side of the flexible covering layer. The flexible covering layer effectively isolates the rotating shaft from the external environment in which it is placed, thereby preventing the rotating shaft from being affected by impurities such as moisture and dust in the external environment, improving the reliability of the rotating shaft, prolonging the service life of the rotating shaft, and ensuring normal use of foldable device.

The beneficial effects provided by the technical solutions according to the embodiments of the present disclosure include at least the following aspects.

The foldable device provided by the embodiment of the present disclosure includes a first housing, a second housing, a flexible display screen, a rotating shaft and a flexible covering layer, wherein the first housing and the second housing are connected by the rotating shaft, the flexible covering layer is respectively connected to the first housing and the second housing and surrounds the outer side of the rotating shaft, and the flexible display screen is respectively connected to the first housing and the second housing and is located on the inner sides of the first housing, the second housing, and the rotating shaft. By covering the flexible covering layer on the outer side of the rotating shaft, the rotating shaft can be effectively isolated from the external environment, so that the rotating function can be ensured, and the rotating shaft can be prevented from being affected by impurities such as moisture and dust in the external environment. By protecting the rotating shaft with the flexible covering layer, the reliability of the rotating shaft is improved, the service life of the rotating shaft is extended, and the normal use of the foldable device is ensured.

Moreover, the rotating shaft of the foldable device provided by the embodiment of the present disclosure includes a first member, a second member, and a connecting member. The first housing is provided with a first slot, the second housing is provided with a second slot, and the first member is engaged with the first slot and the second member is engaged with the second slot. The first member and the second member are connected by the connecting member so that the first housing, the second housing, and the rotating shaft can be stably connected. By covering the flexible covering layer on the outer side of the rotating shaft, the rotating shaft can be effectively isolated from the external environment, so that the rotating shaft can be prevented from being affected by impurities such as moisture and dust in the external environment, the reliability of the rotating shaft is improved, the service life of the rotating shaft is extended, and the normal use of the foldable device is ensured.

Moreover, the lower surface of the flexible covering layer is a flat surface, the side surface is a curved surface. The shape of the flexible covering layer matches the shapes of the first housing and the second housing to ensure that the lower surface and the side surface of the rotating shaft are surrounded by the flexible covering layer, and also it is ensured that the shape of the flexible covering layer is consistent with the surfaces of the first housing and the second housing, thereby ensuring uniformity in appearance of the foldable device.

Those skilled in the art, by considering the present specification and practicing the disclosure herein, will readily conceive of other embodiment(s) of the present disclosure. The present disclosure is intended to cover any variation, purpose or adaptive modification which is in accordance with general principle(s) of the present disclosure and to encompass well-known knowledge or conventional technical means in the art which is not disclosed in the present disclosure. The specification and the embodiments are merely deemed as illustrative, and the true scope and inspirit of the present disclosure are indicated by the appended claims.

It should be appreciated that, the present disclosure is not intended to be limited to any exact structure described above or illustrated in the drawings, and can be modified and changed without departing from the scope thereof. The scope of the present disclosure is defined by the appended claims.

What is claimed is:

1. A foldable device, comprising:
a first housing, a second housing, a flexible display screen, a rotating shaft, and a flexible covering layer, wherein:
the first housing and the second housing are connected by the rotating shaft;
the flexible covering layer is respectively connected to the first housing and the second housing and surrounds an outer side of the rotating shaft, and
the flexible display screen is respectively connected to the first housing and the second housing and is located on inner sides of the first housing, the second housing, and the rotating shaft,
wherein the flexible covering layer comprises:
a first end and a second end, the first end being connected to the first housing, and the second end being connected to the second housing; and
a corrugated layer disposed between the first end and the second end.

2. The foldable device according to claim 1, wherein the rotating shaft comprises:
a first member, a second member, and a connecting member,
wherein the first member and the second member are connected by the connecting member and rotatable about the connecting member, and the flexible covering layer surrounds an outer side of the connecting member;
the first housing is provided with a first slot, and the first member is engaged with the first slot; and
the second housing is provided with a second slot, and the second member is engaged with the second slot.

3. The foldable device according to claim 1, wherein:
the corrugated layer unfolds when the first housing or the second housing rotates about the rotating shaft to bring the first housing close to the second housing; and
the corrugated layer compresses when the first housing or the second housing rotates about the rotating shaft to move the first housing away from the second housing.

4. The foldable device according to claim 1, wherein when the first housing and the second housing are in the same plane, an outer surface of the corrugated layer, an outer surface of the first housing, and an outer surface of the second housing are in the same plane.

5. The foldable device according to claim 1, wherein the flexible covering layer is respectively connected to the first housing and the second housing by a viscous substance, and the viscous substance is a glue or a double-sided tape.

6. The foldable device according to claim 1, wherein the flexible covering layer is composed of a flexible material; and wherein the flexible material is at least one of polyimide (PI), polyethylene terephthalate (PET), thermoplastic polyurethane elastomer (TPU) or silica gel.

7. A method for installing a foldable device according to claim 1, the method comprising:
connecting the flexible covering layer respectively to the first housing and the second housing; and
connecting the rotating shaft respectively to the first housing and the second housing such that the rotating shaft is located on an inner side of the flexible covering layer.

8. The method of claim 7, wherein the rotating shaft includes: a first member, a second member, and a connecting member, and the connecting the rotating shaft being respectively to the first housing and the second housing comprises:
engaging the first member with a first slot provided in the first housing; and
engaging the second member with a second slot provided in the second housing.

9. The method according to claim 7, further comprising at least one of:
unfolding the corrugated layer of the flexible covering layer during rotation of the first housing about the rotating shaft and close to the second housing; or
unfolding the corrugated layer of the flexible covering layer during rotation of the second housing about the rotating shaft and close to the first housing.

10. The method according to claim 7, further comprising at least one of:
compressing the corrugated layer of the flexible covering layer during rotation of the first housing about the rotating shaft and away from the second housing; or
compressing the corrugated layer of the flexible covering layer during rotation of the second housing about the rotating shaft and away from the first housing.

* * * * *